United States Patent
Hirabayashi et al.

(10) Patent No.: US 8,525,658 B2
(45) Date of Patent: Sep. 3, 2013

(54) INTERIOR TIRE POWER GENERATION APPARATUS AND TIRE MONITORING SYSTEM USING THE SAME

(75) Inventors: Yasutoshi Hirabayashi, Ashigarakami-gun (JP); Yukio Sakashita, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 365 days.

(21) Appl. No.: 12/891,582

(22) Filed: Sep. 27, 2010

(65) Prior Publication Data

US 2011/0074564 A1    Mar. 31, 2011

(30) Foreign Application Priority Data

Sep. 28, 2009    (JP) ................. 2009-222084

(51) Int. Cl.
   *B60C 23/00*    (2006.01)
   *G08B 21/00*    (2006.01)
   *H01L 41/00*    (2013.01)
   *H02N 2/00*    (2006.01)

(52) U.S. Cl.
   USPC ........ 340/447; 340/442; 340/665; 340/693.1; 310/311; 310/314; 310/338; 310/339; 73/146; 73/146.5

(58) Field of Classification Search
   USPC ............. 340/447, 442; 310/314, 339
   See application file for complete search history.

(56) References Cited

U.S. PATENT DOCUMENTS 7,415,874 B2    8/2008    Mancosu et al.
2005/0156491 A1    7/2005    Scott
2009/0230211 A1    9/2009    Kobayashi et al.
2009/0267998 A1    10/2009    Sakashita et al.
2010/0103226 A1    4/2010    Sakashita et al.

FOREIGN PATENT DOCUMENTS

WO    03/095244 A1    11/2003
WO    2008088086 A1    7/2008

OTHER PUBLICATIONS

R. D. Shannon, "Revised Effective Ionic Radii and Systematic Studies of Interatomic Distances in Halides and Chalcogenides", Acta Cryst. 1976, pp. 751-767, vol. A32.
Ceramic Society of Japan, "Ceramic Composites, Chapter 2, Ceramic-Plastic Composite Piezoelectric Bodies", published by Baifukan Co., Ltd., 25 pages.
Yasuharu Hosono, et al., "High-Efficiency Piezoelectric Single Crystals", Toshiba Review, 2004, pp. 39-42, vol. 59, No. 10, English Abstract.
European Search Report; Application No. 10179926.0-2222/2301770; Dec. 17, 2012.

*Primary Examiner* — Donnie Crosland
(74) *Attorney, Agent, or Firm* — Sughrue Mion, PLLC

(57) ABSTRACT

An interior tire power generation apparatus includes a piezoelectric section having an inorganic piezoelectric body of a perovskite type oxide represented by General Formula (PX) below; a pair of electrodes for extracting an electric charge generated in the piezoelectric section when strained by an external force exerted on the tire; and an energy storage unit for storing the extracted electric charge.

$$(Bi_x, A_{1-x})(B_y, C_{1-y})O_3 \quad (PX)$$

where, A is an A-site element, other than Pb, with an average ionic valence of 2, B is a B-site element with an average ionic valence of 3, C is a B-site element with an average ionic valence of greater than 3, and each of A, B, and C is one or a plurality of types of metal elements. O is oxygen. B and C are of different compositions. $0.6 \leq x \leq 1.0$, $x-0.2 \leq y \leq x$.

10 Claims, 6 Drawing Sheets

▲ $(Ba_{0.22}Bi_{0.78})(Ti_{0.17}Fe_{0.79}Mn_{0.04})O_3$
△ $(Ba_{0.22}Bi_{0.78})(Ti_{0.17}Fe_{0.79}Mn_{0.04})O_3$
▼ $(Ba_{0.3}Bi_{0.7})(Ti_{0.29}Fe_{0.66}Mn_{0.05})O_3$
▽ $(Ba_{0.3}Bi_{0.7})(Ti_{0.29}Fe_{0.66}Mn_{0.05})O_3$
⊙ $(Ba_{0.15}Bi_{0.8}Sr_{0.05})(Ti_{0.19}Fe_{0.76}Mn_{0.05})O_3$
◎ $(Ba_{0.15}Bi_{0.8}Sr_{0.05})(Ti_{0.19}Fe_{0.76}Mn_{0.05})O_3$
◼ $(Ba_{0.2}Bi_{0.8})(Ti_{0.15}Fe_{0.75}Nb_{0.05}Mn_{0.05})O_3$
◻ $(Ba_{0.2}Bi_{0.8})(Ti_{0.15}Fe_{0.75}Nb_{0.05}Mn_{0.05})O_3$

- × NON-LEAD CERAMICS 2-4 SYSTEM
- ◇ NON-LEAD CERAMICS 1-5 SYSTEM
- ◆ NON-LEAD FILM
- ○ LEAD BASED CERAMICS
- × LEAD BASED FILM
- ▲ $(Ba_{0.22}Bi_{0.78})(Ti_{0.17}Fe_{0.79}Mn_{0.04})O_3$
- △ $(Ba_{0.22}Bi_{0.78})(Ti_{0.17}Fe_{0.79}Mn_{0.04})O_3$
- ▼ $(Ba_{0.3}Bi_{0.7})(Ti_{0.29}Fe_{0.66}Mn_{0.05})O_3$
- ▽ $(Ba_{0.3}Bi_{0.7})(Ti_{0.29}Fe_{0.66}Mn_{0.05})O_3$
- ⊙ $(Ba_{0.15}Bi_{0.8}Sr_{0.05})(Ti_{0.19}Fe_{0.76}Mn_{0.05})O_3$
- ◎ $(Ba_{0.15}Bi_{0.8}Sr_{0.05})(Ti_{0.19}Fe_{0.76}Mn_{0.05})O_3$
- ◪ $(Ba_{0.2}Bi_{0.8})(Ti_{0.15}Fe_{0.75}Nb_{0.05}Mn_{0.05})O_3$
- ◩ $(Ba_{0.2}Bi_{0.8})(Ti_{0.15}Fe_{0.75}Nb_{0.05}Mn_{0.05})O_3$

INTERIOR TIRE POWER GENERATION APPARATUS AND TIRE MONITORING SYSTEM USING THE SAME

BACKGROUND OF THE INVENTION

1. Field of the Invention

The present invention relates to an apparatus for generating power from a mechanical energy of a rolling tire and a system for monitoring a physical parameter of the tire using the apparatus.

2. Description of the Related Art

Systems currently in practical use for monitoring physical parameters of tires, such as a tire pressure monitoring system (TPMS) that monitors a pressure of a rolling tire and passes the pressure information to the driver in real time, uses a button battery as the power source. The button batteries, however, cause problems that they limit applicable wheel shapes depending on the size thereof and require time and money for each replacement since they have a limited operating life. Further, the battery provides power by chemical reaction and poses a problem of power instability in the interior of a tire where temperature variation is very large.

In order to solve these problems, tire monitoring systems that do not use batteries and, instead, make use of vibrations of rolling tires for power generation and vibration power generators for use with the systems have been studied. For example, International Patent Publication No. WO2003/095244 discloses a self-powered tire assembly having a patch of piezoelectric material for generating an electric charge from a mechanical strain developed in a tire. The document also describes that silica, barium titanate, cadmium sulfide, zirconate titanate (PZT), polyvinylidene fluoride, polyvinyl chloride (PVC) are preferably used as the piezoelectric material. U.S. Pat. No. 7,415,874 discloses an electrical energy generation system having a power source of piezoelectric device linked to a tread area of a tire, in which PZT is used as the material of the piezoelectric device.

Non-lead piezoelectric materials among the piezoelectric materials described in the patent documents other than PZT, however, has low piezoelectric performance and unable to provide sufficient power. In contrast, PZT provides markedly superior piezoelectric performance in comparison with other materials, but it contains highly poisonous Pb, which may leak out from waste products in the manufacturing process, from materials in use, or from those discarded after use, thereby causing environmental problems, including soil pollution, air pollution, and the like.

The present invention has been developed in view of the circumstances described above, and it is an object of the present invention to provide a non-lead interior tire power generation apparatus having high power generation capability and a tire monitoring system using the apparatus.

SUMMARY OF THE INVENTION

An interior tire power generation apparatus of the present invention is an apparatus to be fixed on an interior surface of a tire, comprising: a piezoelectric section having an inorganic piezoelectric body of a perovskite type oxide represented by General Formula (PX) below; a pair of electrodes for extracting an electric charge generated in the piezoelectric section when the section is strained by an external force exerted on the tire; and an energy storage unit for storing the extracted electric charge.

$$(Bi_x, A_{1-x})(B_y, C_{1-y})O_3 \tag{PX}$$

where, A is an A-site element, other than Pb, with an average ionic valence of 2, B is a B-site element with an average ionic valence of 3, C is a B-site element with an average ionic valence of greater than 3, and each of A, B, and C is one or a plurality of types of metal elements. O is oxygen. B and C are of different compositions. $0.6 \leq x \leq 1.0$, $x-0.2 \leq y \leq x$. Although the ratio of a total molar amount of A-site elements or of B-site elements to a molar amount of the oxygen atom is normally 1:3, the ratio may deviate from 1:3 within a range in which a perovskite structure can be obtained.

Preferably, in the interior tire power generation apparatus of the present invention, the A-site element A is at least one type of metal element selected from the group consisting of Mg, Ca, Sr, Ba, (Na, Bi), and (K, Bi). Here, the representation of (Na, Bi) or (K, Bi) refers to a mixture of the two elements in the pair of parenthesis with an average ionic valence of 2. In this case, equimolar mixture of Na or K having an ionic valence of 1 and Bi having an ionic valence of 3 will result in an average ionic valence of 2.

Further, it is preferable that the B-site element B is at least one type of metal element selected from the group consisting of Al, Sc, Cr, Mn, Fe, Co, Ni, Cu, Ga, Y, In, and Re (rare-earth element).

In the interior tire power generation apparatus of the present invention, it is preferable that a piezoelectric strain constant $d_{33}$ (pm/V) and a relative dielectric constant $\in_{33}$ of the inorganic piezoelectric body satisfy Formulae (1) and (2) below.

$$100 < \in_{33} < 1500 \tag{1}$$

$$d_{33}(pm/V) > 12\sqrt{\in_{33}} \tag{2}$$

Here, the first and second subscripts of the double subscripts in $d_{33}$ and $\in_{33}$ indicate, when three orthogonal axes 1, 2, and 3 are defined, the application direction of electric field and strain direction respectively, indicating, in this case, an axial vibration mode in which the extraction direction of strain is parallel to the application direction of electric field. Thus, $d_{33}$ and $\in_{33}$ indicate piezoelectric strain constant and dielectric constant in the axial vibration mode respectively.

Still further, it is preferable that the piezoelectric strain constant $d_{33}$ and the relative dielectric constant $\in_{33}$ of the inorganic piezoelectric body satisfy Formulae (3) and (4) below.

$$100 < d_{33}(pm/V) \tag{3}$$

$$80 < g_{33}(\times 10^{-3} V \cdot m/N) \tag{4}$$

(where, $g_{33}$ is the voltage output constant of the piezoelectric body.) It is particularly preferable that the perovskite type oxide includes $BaTiO_3$ as a first component and $BiFeO_3$ as a second component.

Further, the perovskite type oxide, represented by General Formula (PX), includes a first component with a tolerance factor greater than 1.0 and a second component with a tolerance factor smaller than 1.0, and satisfies Formula (5) below.

$$0.97 \leq TF(PX) \leq 1.02 \tag{5}$$

where, TF(PX) represents the tolerance factor of the oxide represented by General Formula (PX). The term "tolerance factor TF" as used herein refers to the factor represented by the formula below.

$$TF = (rA + rO)/\sqrt{2}(rB + rO)$$

(where, rA represents the average ionic radius in A-site, rB represents the average ionic radius in B-site, and rO represents the ionic radius of oxygen.) The term "ionic radius" as used herein refers to a so-called Shannon ionic radius (R. D. Shannon, "Revised Effective Ionic Radii and Systematic Studies of Interatomic Distances in Halides and Chalcogenides", Acta. Cryst. A32, pp. 751-767, 1976). The term "average ionic radius" as used herein refers to a quantity represented by ΣCiR, in which C is a molar fraction of lattice site ions and R is an ionic radius. "A covalent bonding radius" is used for the ionic radius of 12-coordinate Bi, because it is not described in the aforementioned documents and such Bi has strong covalent bonding.

Each tolerance factor is theoretically obtained based on the formula above. In this case, the tolerance factor of an oxide which can not take a perovskite type structure alone is also obtained. (TF($BaTiO_3$)=1.062, TF($BiFeO_3$)=0.989). Then it is preferable to determine the composition of General Formula (PX) so as to satisfy Formula (1) above.

In General Formula (PX), it is preferable that the difference between an average atomic weight $M_A$ of the A-site elements and an average atomic weight $M_B$ of the B-site elements, $|M_A-M_B|$, is greater than 145.

In the interior tire power generation apparatus, it is preferable that the piezoelectric section includes a polymer composite piezoelectric body constituted by an organic polymer resin matrix and the inorganic piezoelectric body included in the matrix.

The term "polymer composite piezoelectric body" as used herein refers to, as described in the section under the "Description of the Related Art", a composite body of a polymer matrix resin and a piezoelectric body, including those generally called as the "composite piezoelectric body" (Ceramic Society of Japan, "Ceramic Composites, Chapter 2, Ceramic-Plastic Composite Piezoelectric Bodies", published by Baifukan Co., Ltd).

Preferably, the polymer composite piezoelectric body has 1-3 connectivity. The term "connectivity of the polymer composite piezoelectric body" as used herein refers to composite body connectivity proposed by Newnham, et al. (R. E. Newnham, et al., "Connectivity and piezoelectric-pyroelectric composites", Mater. Res. Bull. Vol. 13, Issue 5, pp. 525-536, 1978). More specifically, the polymer composite piezoelectric body is assumed to be a dice like mass and, when the body is broken into 3 axes of XYZ, the number of axes of the three axes to which the piezoelectric body is self-connected is represented by m and the number of axes of the three axes to which the polymer is self-connected is represented by n, thereby denoting as m-n connectivity. Thus, 1-3 type connectivity refers to a structure in which the piezoelectric body is self-connected only to one axis direction and the polymer is self-connected to each of the three axes.

A tire monitoring system of the present invention is a system, including: the interior tire power generation apparatus of the present invention described above; at least one sensor for detecting a predetermined property of the tire; and a wireless frequency unit for transmitting information obtained from the property detected by the sensor to a remote location so as to be monitored at the remote location, wherein the wireless frequency unit and/or the sensor is connected to the energy storage unit to receive power from the storage unit.

The interior tire power generation apparatus of the present invention includes a piezoelectric section for generating an electric charge from deformation of a rolling tire, and the piezoelectric section includes an inorganic piezoelectric body of a perovskite type oxide (which may include an unavoidable impurity) having a composition represented by General Formula (PX) above. The present inventors have devised a material design method for providing high piezoelectric performance (d constant) for non-lead perovskite type oxides, and have found out, for the first time, such a perovskite type oxide as a composition having high piezoelectric performance comparable to that of a lead perovskite type oxide. Therefore, according to the present invention, a non-lead interior tire power generation apparatus having high power generation capability and a tire monitoring system using the apparatus may be provided.

Further, the present inventors have found out, in the material design, a composition which is excellent in d constant, g constant, and balance between them. The performance index of power generation capability of a power generation apparatus is represented by the product of d constant and g constant. It is, therefore, preferable that the perovskite type oxide has a high value not only for the d constant but also for the g constant. Use of an inorganic piezoelectric body of such perovskite type oxide (which may include an unavoidable impurity) allows an unprecedented high performance interior tire power generation apparatus, excellent in both d constant and g constant, to be realized.

DESCRIPTION OF THE PREFERRED EMBODIMENTS

[Interior Tire Power Generation Apparatus, Tire Monitoring System]

Figure 1A:
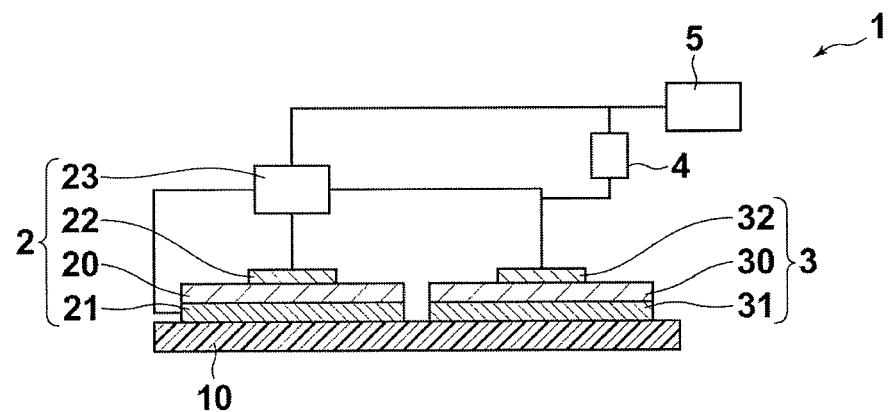
FIG. 1A is a schematic cross-sectional view of an interior tire power generation apparatus and a tire monitoring system according to an embodiment of the present invention, illustrating the configuration thereof.
Figure 1B:
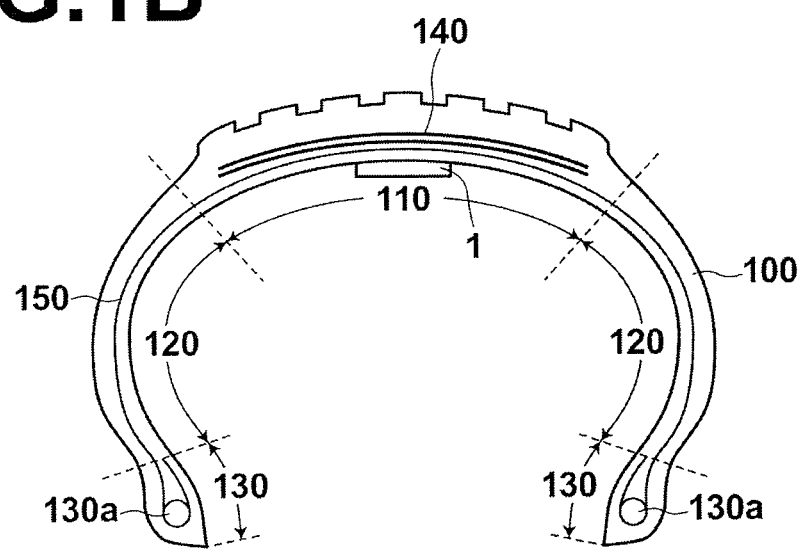
FIG. 1B is a schematic cross-sectional view of a tire in which the interior tire power generation apparatus and the tire monitoring system shown in FIG. 1A are attached, illustrating the configuration thereof.

Hereinafter, an interior tire power generation apparatus and tire monitoring system according to an embodiment of the present invention will be described. FIG. 1A is a schematic view of the interior tire power generation apparatus and the tire monitoring system of the present embodiment. FIG. 1B schematically illustrates the positional relationship of tire monitoring system 1 of the present embodiment inside of a tire. Each component is not necessarily drawn to scale for easy recognition.

As shown in FIG. 1B, tire monitoring system 1 is fixed on the inner surface of tire 100 for use. Tire 100 mainly includes crown section 110 having a tread section on the outer side, sidewall section 120, and bead section 130 having tire bead 130a for attaching tire 100 to the rim of a wheel(not shown). Carcass 150, which defines a shape of the tire under a tire pressure and conveys traction and steering power, is formed inside of tire 100, extending over side wall section 120 and crown section 110 to bead section 130. Belt package 140 is provided inside of crown section 110 of tire 100

Tire monitoring system 1 and interior tire power generation apparatus 2 operate on the strain developed by an external force. As such, they may be fixed to any portion of a tire if it is strained by an external force, but it is preferable that they are fixed to a portion where a large strain is produced. FIG. 1B illustrates, byway of example, an embodiment in which they are fixed to the rear surface of crown section 110 where the tread of the tire is formed, but they may be effectively fixed to the rear surface of sidewall section 120.

Tire monitoring system 1 includes, on flexible substrate 10 of a polymer resin, interior tire power generation apparatus 2, sensor 3 for detecting a predetermined characteristic, wireless frequency unit 5 for transmitting information obtained from the characteristic detected by sensor 3 to a remote location, such as the interior of the car, and controller 4 for controlling the operation of these components. In the present embodiment, sensor 3 and wireless frequency unit 5 are connected so as to be supplied power from interior tire power generation apparatus 2.

In the present embodiment, sensor 3 is a piezoelectric device for detecting a strain amount of a tire and when the piezoelectric body is strained by a strain of the tire, a voltage is applied between a pair of electrodes (31, 32) and a detected strain amount is outputted to wireless frequency unit 5 via controller 4. In the present embodiment, sensor 3 is provided on the same substrate 10 as that of interior tire power generation apparatus 2, but it is noted that the configuration is not limited to this.

Controller 4 is a microcontroller for controlling each power supply timing and signal output timing from sensor 3 to wireless frequency unit 5. There is not any specific restriction on controller 4 as long as it is capable of performing such timing control, but it is preferable that the controller includes an A/D converter for converting a signal from sensor 3 to digital information.

Wireless frequency unit 5 receives a signal from sensor 3, modulates the signal with an FM carrier signal, and transmits strain information of tire 100 to a receiver (not shown) in a remote location.

Interior tire power generation apparatus 2 includes piezoelectric section 20 having an inorganic piezoelectric body, a pair of electrodes (21, 22) for extracting an electric charge generated in piezoelectric section 20 when the section is strained by an external force exerted on the tire, and energy storage unit 23 for storing the extracted electric charge.

As for substrate 10, a film-like flexible substrate with a thickness of 200 82 m or less is preferably used. Such a substrate may be made of polyimide, PTFE, polyethylene naphthalate, polypropylene, polystyrene, polycarbonate, polysulphone, polyarylate, polyamide, or the like, which may be selected according to the usage environment of the tire and in consideration of heat tolerance, moisture absorbency, and the like. In order to avoid detachment of the substrate from the surface of the tire due to deformation thereof, a synthetic rubber having a similar rigidity to that of the tire, such as acrylic rubber, acrylonitrile butadiene rubber, isoprene rubber, urethane rubber, butadiene rubber, silicone rubber, and the like, are more preferably used.

There is not any specific restriction on electrodes 21, 22 as long as they are capable of appropriately extracting the electric charge generated in piezoelectric section 20. For example, Sn, Al, Ni, Pt, Au, Ag, Cu, Cr, Mo, and the like maybe cited as the material. Preferably, the film thickness of electrodes 21, 22 minimizes the restriction on the strain of piezoelectric section 20 and is preferable to be 1 μm or less, although it is dependent on the size of electrodes 21, 22. Such electrodes may be formed by a gas-phase film forming method, such as vacuum deposition method, sputtering, or the like.

Energy storage unit 23 is a unit that rectifies and stores the electric charge generated in piezoelectric section 20. There is not any specific restriction on energy storage section 23 as long as it has such a function and it may be formed, for example, of a rectifier and a capacitor.

Interior tire power generation apparatus 2 generates power by causing piezoelectric section 20 to generate an electric charge by the strain developed in the tire. Therefore, power generation performance of the apparatus increases as the piezoelectric performance of piezoelectric section 20 increases. As such, it is preferable that piezoelectric section 20 uses an inorganic piezoelectric body having an excellent piezoelectric performance.

Also, piezoelectric section 20 needs to have a sufficient flexibility to withstand the strain developed in the tire. If an inorganic piezoelectric body has such a degree of flexibility, it may be used directly as piezoelectric section 20, but it is preferable that a polymer composite piezoelectric body (piezoelectric composite), in which an inorganic piezoelectric body is included in a matrix of polymer resin, is used since the inorganic piezoelectric body is relatively fragile.

It is also known that the piezoelectric composite has a superior power output constant (piezoelectric g constant) in comparison with the inorganic piezoelectric body, in addition to a high degree of flexibility. The product of piezoelectric d constant and piezoelectric g constant is indicative of the power generation performance and it is, therefore, most preferable to use a piezoelectric material having both a high d constant and a high g constant. A configuration of a piezoelectric composite and an inorganic piezoelectric body included in the piezoelectric composite will now be described.

Figure 2A:
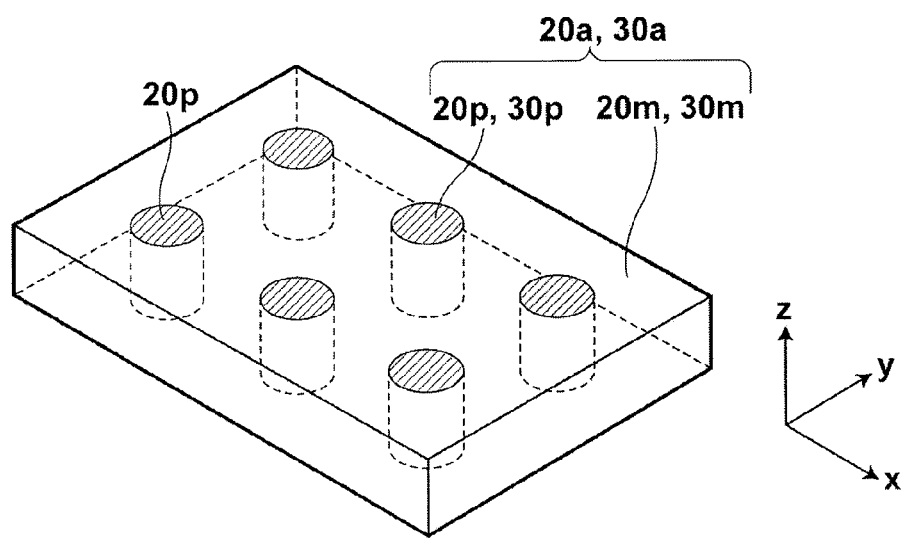
FIG. 2A is a schematic view of a piezoelectric section of piezoelectric composite with 1-3 connectivity, illustrating the configuration thereof.
Figure 2B:
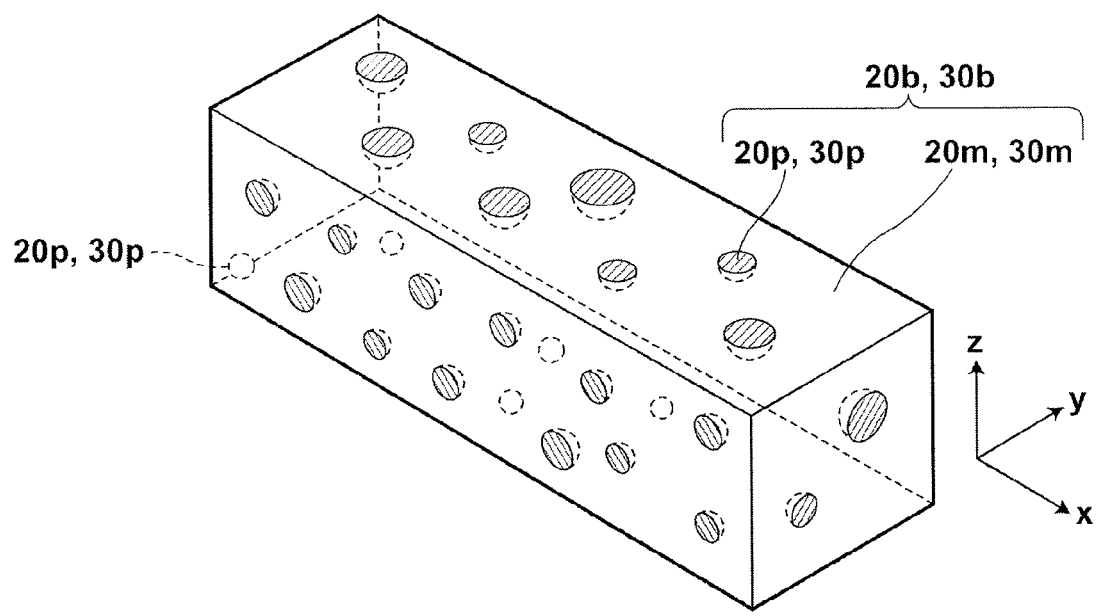
FIG. 2B is a schematic view of a piezoelectric section of piezoelectric composite with 0-3 connectivity, illustrating the configuration thereof.

FIG. 2A is a schematic perspective view of a piezoelectric composite having 1-3 connectivity (hereinafter, referred to as the "1-3 composite"), and FIG. 2B is a schematic perspective view of a piezoelectric composite having 0-3 connectivity (hereinafter, referred to as the "0-3 composite").

In the 1-3 composite in FIG. 2A, the piezoelectric composite 20a takes the form in which a plurality of pillar-like (fiber-like) piezoelectric bodies 20p is independently disposed in a polymer matrix 20m such that a long axis direction thereof is substantially parallel to z axis direction. One pillar-like piezoelectric body 20p has connectivity only in the z axis direction, and the polymer matrix 20m covers around each pillar.

The piezoelectric composite 20a may be produced by a method of manufacturing an ordinary 1-3 composite. For example, the composite 20a may be produced by making arrays of pillar-like piezoelectric bodies 20a using a die-cast method or a multi-blade wafering saw for producing wafers and pouring a polymer resin into a gap between the arrays.

Figure 6:
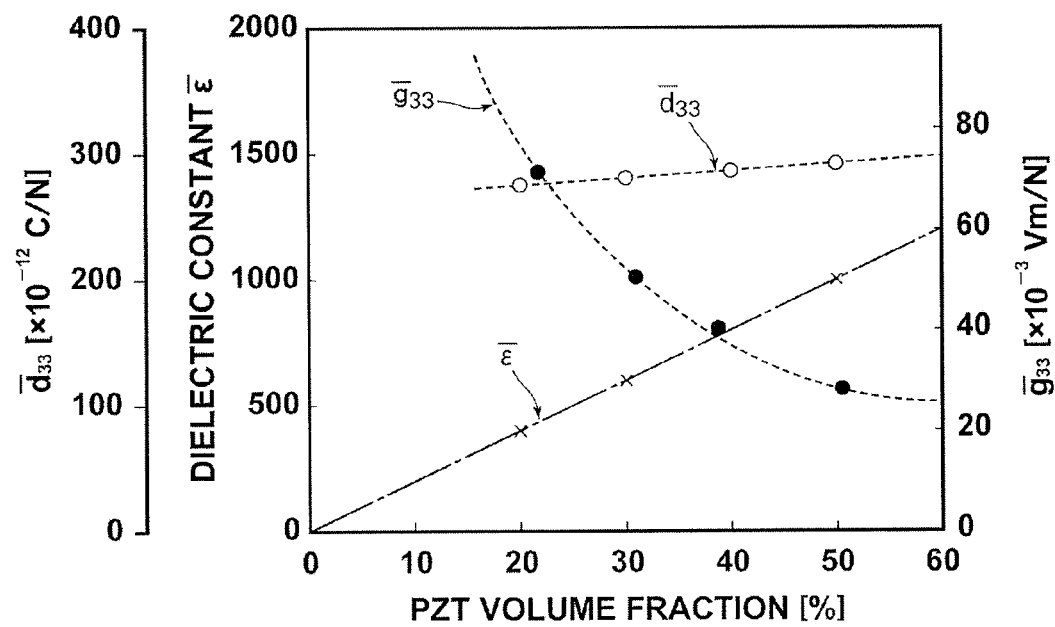
FIG. 6 illustrates volume fraction dependency of dielectric constant $\in$, piezoelectric constant $d_{33}$, and $g_{33}$ of 1-3 composite when PZT is used.

Generally, when an electric field is applied to the 1-3 piezoelectric composite 20a, pillar-like piezoelectric bodies 20p can stretch easily since the polymer matrix around the bodies is soft. FIG. 6 illustrates volume fraction dependency of dielectric constant $\in$, piezoelectric constant $d_{33}$, and $g_{33}$ of a 1-3 composite when PZT is used as the piezoelectric body (Ceramic Society of Japan, "Ceramic Composites, Chapter 2, Ceramic-Plastic Composite Piezoelectric Bodies, FIG. 2.14", published by Baifukan Co., Ltd). Therefore, an effective value of $d_{33}$ substantially corresponding to that of the piezoelectric bodies $20p$ may be obtained for the piezoelectric composite $20a$ when polarized sufficiently. In the mean time, the dielectric constant of the piezoelectric composite $20a$ becomes close to that of the piezoelectric bodies $20p$ as the volume fraction of the piezoelectric bodies $20p$ increases. The piezoelectric g constant becomes small as the volume fraction of the piezoelectric bodies $20p$ having a higher dielectric constant than that of the polymer matrix material increases, because the piezoelectric g constant is inversely proportional to the dielectric constant.

As shown in FIG. 2B, the 0-3 composite $20b$ takes the form in which piezoelectric bodies $20p$ of, for example, a particle shape, a whisker shape, a fiber shape, or the like, having no connectivity in x, y, and z directions, are distributed in a polymer matrix $20m$.

Also the 0-3 composite may be produced by a method of producing an ordinary 0-3 composite or a polymer film manufacturing method. For example, the 0-3 composite may be produced by mixing and kneading piezoelectric powder in a molten polymer matrix material and then by a molten film forming method, such as injection molding, extrusion molding, T-die method, or the like, or a solution film forming method, such as casting or the like. In the solution film forming, if the piezoelectric bodies $20p$ have an anisotropic shape, such as whisker shape, fiber shape, or the like, the particles may be oriented easily, by fixing an application direction of the solution, such that a long axis direction thereof is substantially parallel to the application direction of the solution.

As the 0-3 composite has less connectivity of piezoelectric bodies $20p$ in comparison with the 1-3 composite, the piezoelectric d constant is also influenced by the volume fraction. Consequently, it is difficult to obtain a d constant value substantially identical to that of piezoelectric bodies $20p$ as in the 1-3 composite, but may have a superior g constant value in comparison with that of the piezoelectric bodies $20p$.

Preferably, a polarization process is performed on the piezoelectric composite $20a$, $20b$ regardless of whether it is a 1-3 composite or a 0-3 composite. In the case of 1-3 composite, the piezoelectric bodies $20p$ are in direct contact with electrodes, so that it is possible to perform the polarization process on the composite after formed using the electrodes. In the case of 0-3 composite, piezoelectric powder of anisotropic shape polarized in advance maybe oriented in a fixed direction in the manner as described above. This is preferable since the polarization axes may be aligned and high piezoelectric performance (d constant) may be obtained.

There is not any specific restriction on the polymer matrix $20m$ of the piezoelectric composites $20a$, $20b$ as long as it is an organic polymer resin having sufficient heat tolerance under usage environment of the tire. For example, commodity plastics, such as polypropylene, polytetrafluoroethylene (PETF), acrylic resin, and the like, engineering plastics, such as polyamide, polycarbonate polyethylene terephthalate (PET), thermoplastic polyimide, and the like, synthetic rubbers, such as acrylic rubber, acrylonitrile butadiene rubber, isoprene rubber, urethane rubber, butadiene rubber, silicone rubber, and the like, piezoelectric polymers, such as polyvinylidene fluoride (PVDF), copolymer of PVDF, and the like, and thermoset resins, such as phenol resin, epoxy resin, melamine resin, polyimide, and the like may be cited. Preferably, the polymer matrix $20m$ has good bonding with piezoelectric bodies $20p$. In order to efficiently convert a strain of the tire to a strain of the piezoelectric body, it is more preferable to match the rigidity (acoustic impedance) of the piezoelectric body with those of the tire and flexible substrate.

As already described, a piezoelectric material having a large product of piezoelectric strain constant (d constant) and power output constant (g constant) is preferable for power generation applications. Therefore, as for the piezoelectric body $20p$, a material having a high piezoelectric d constant and a relatively low dielectric constant for not causing g constant of the polymer matrix is preferable. Hereinafter, the piezoelectric body $20p$ used for the piezoelectric composites $20a$, $20b$, including a material design method, will be described.

As described in the section under "Description of the Related Art" above, the present invention uses a non-lead piezoelectric body not containing highly poisonous Pb. The present inventors have repeated studies for material designs of non-lead perovskite type oxides having high piezoelectric performance and have found out a composition, for the first time in non-lead perovskite type oxides, having piezoelectric performance comparable to that of a lead perovskite type oxide.

Piezoelectric strains may include the following:

(1) an ordinary field-induced piezoelectric strain in which expansion or contraction occurs in a direction of applied electric field when the vector component of spontaneous polarization axis corresponds to the direction of applied electric field according to the increase or decrease in applied electric field intensity (intrinsic piezoelectric strain);

(2) a piezoelectric strain produced by increasing or decreasing the electric field intensity and reversibly rotating the polarization axis by non-180° ;

(3) a piezoelectric strain caused by the change in volume due to crystal phase transitions induced by increasing or decreasing the electric field intensity; and (4) a piezoelectric strain that makes use of engineered domain effect, which is capable of providing a larger strain, obtained by using a material having a property to cause phase transitions by the application of an electric field and forming a crystal orientation structure containing a ferroelectric phase having crystal orientation in a direction different from the spontaneous polarization direction (when making use of the engineered domain effect, the piezoelectric body may be driven under the condition in which phase transitions occur or under the condition in which phase transitions do not occur).

The piezoelectric strain in (1) above is an intrinsic piezoelectric strain, while the piezoelectric strains in (2) to (4) are extrinsic piezoelectric strains. In each of the piezoelectric strains described in (1) to (4) above, a large piezoelectric strain may be obtained by forming the piezoelectric body to have a composition and a crystal orientation structure according to the strain generation mechanism. The piezoelectric strains described in (1) to (4) above may be used individually or in combination.

It is reported that, in bulk ceramics of a lead based perovskite type oxide with MPB composition, there is a correlation between the piezoelectric strain constant (d constant) and the difference $|M_A-M_B|$ between average atomic weight of A-site elements $M_A$ and average atomic weight of B-site elements $M_B$, and the greater the $|M_A-M_B|$, the higher the electromechanical coupling coefficient k and greater the d constant (Y. Hosono and Y. Yamashita, "High-Efficiency Piezoelectric Single Crystals", Toshiba Review, Vol. 59, No. 10, p. 41, 2004). The present inventors have found out that non-lead perovskite type oxides also have a similar correlation.

Therefore, it is said that a piezoelectric body having a superior piezoelectric strain constant may be obtained by selecting an A-site element and a B-site element such that $|M_A-M_B|$ becomes large. For example, an element with a mass $M_A$ as large as possible may be selected as the A-site element while an element with a mass $M_B$ as small as possible may be selected as the B-site element. Judging from the values of $|M_A-M_B|$ in lead perovskite oxides described in the aforementioned documents, the value of $|M_A-M_B|$ is preferable to be greater than 145.

In perovskite type oxides, the element that can be included in each site is mostly limited by the ionic radius and ionic valence.

The present inventors have reported, in U.S. Patent Application Publication No. 20100103226, that a high value of electromechanical coupling coefficient $k_{33}$ and excellent piezoelectric performance are achieved in non-lead perovskite type oxide by designing the composition to become morphotropic phase boundary (MPB) or near MPB in a Bi-based (atomic weight of 209.0) perovskite type oxide. The term "near MPB" as used herein refers to a range in which a phase transition occurs when an electric field is applied.

The present inventors have presumed, in addition to MPB composition, that the mass difference between the A-site element and B-site element contributes, not a little, to the piezoelectric performance, and have found out that a high d constant value may be achieved in a non-lead piezoelectric body by using Bi (atomic weight of 209.0) as an A-site element of large mass that allows composition design such that $|M_A-M_B|$ exceeds 145. More specifically, a high d constant value may be achieved in a non-lead piezoelectric body by forming the body with a perovskite type oxide (which may include an unavoidable impurity) having a composition represented by General Formula (PX) below.

$$(Bi_x, A_{1-x}) (B_y, C_{1-y})O_3 \quad\quad (PX)$$

(where, A is an A-site element, other than Pb, with an average ionic valence of 2, B is a B-site element with an average ionic valence of 3, C is a B-site element with an average ionic valence of greater than 3, and each of A, B, and C is one or a plurality of types of metal elements. 0 is oxygen. B and C are of different compositions. $0.6 \leq x \leq 1.0$, $x-0.2 \leq y \leq x$. Although the ratio of a total molar amount of A-site elements or of B-site elements to a molar amount of the oxygen atom is normally 1:3, the ratio may deviate from 1:3 within a range in which a perovskite structure can be obtained.)

As Formula (PX) indicates, A-site may include only Bi or may further include an element A, other than Pb, with an average ionic valence of 2. Preferably, the element A is at least one type of metal element selected from the group consisting of Mg, Ca, Sr, Ba, (Na, Bi), and (K, Bi).

The major component (60 mol % or more) of A-site element is Bi with an ionic valence of 3, so that the B-site element B is a metal element with an average ionic valence of 3 which is preferable to be an element with a small mass. As for such B-site element B, at least one type of metal element selected from the group consisting of Al, Sc, Cr, Mn, Fe, Co, Ni, Cu, Ga, Y, In, and Re (rare-earth element) may be cited as an example.

When A-site includes element A, it is preferable that a metal element with an average ionic valence of 4 is included in the same mole number as that of the element A as the element C in B-site, since the element A has an average ionic valence of 2. If the element C is greater than the same mole number, the element C acts as a donor dopant and may be included up to 20%. The element C may be an element with an average ionic valence of greater than 4. In this case, even with the same mole number as that of element A, the element C with an average ionic valence of greater than 4 acts as a donor dopant. The element C as the dopant may be included up to 20%. When the element A is not included, the element C acts as a donor dopant when the average ionic valence thereof is 4 or more. As for the element C as a dopant, Nb, Mn, or the like is preferably used.

A perovskite type oxide represented by General Formula (PX) is preferable to have such a composition that the piezoelectric strain constant $d_{33}$ (pm/V) and the relative dielectric constant $\in_{33}$ of the piezoelectric body 20p satisfy Formulae (1) and (2) below.

$$100 < \in_{33} < 1500 \quad\quad (1)$$

$$d_{33}(\text{pm/V}) > 12\sqrt{\in_{33}} \quad\quad (2)$$

Generally, the piezoelectric strain constant $d_{33}$ in the longitudinal vibration mode of the ordinary field-induced piezoelectric strain (intrinsic piezoelectric strain) (pm/V) already described and relative dielectric constant $\in_{33}$ are in the relationship of $d_{33}=k_{33}\sqrt{s}\sqrt{\in_0}\sqrt{\in_{33}}$, and it is known that power output constant $g_{33}$ can be calculated as $g_{33}=d_{33}/\in_0\in_{33}$. That is, in intrinsic piezoelectric strain, when $\alpha=k_{33}\sqrt{s}\sqrt{\in_0}$, $d_{33}$ is proportional to $\sqrt{\in_{33}}$, while $g_{33}$ is inversely proportional to $\sqrt{\in_{33}}$ ($k_{33}$ is the electromechanical coupling coefficient, $\in_0$ is the vacuum dielectric constant (N/V²), and s is the elastic compliance (m²/N)).

Figure 3:
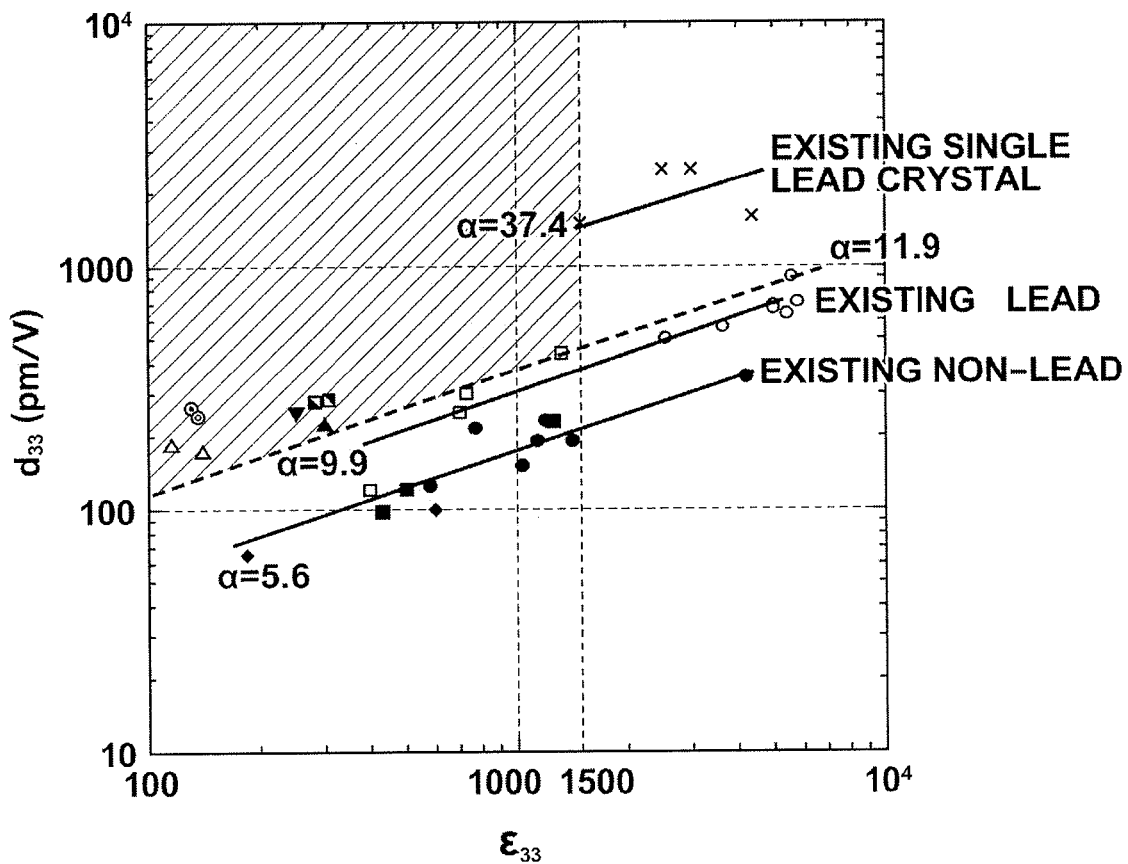
FIG. 3 illustrates the relationship between the dielectric constant and piezoelectric strain constant of a non-lead piezoelectric body of the present invention and existing piezoelectric bodies of lead and non-lead materials.

In the known Pb and non-Pb materials developed so far, and the Pb and non-Pb materials capable of providing high intrinsic piezoelectric strain developed and disclosed by the present inventors, it has been confirmed that $d_{33}$ is substantially proportional to $\sqrt{\in_{33}}$ (FIG. 3).

Figure 4:
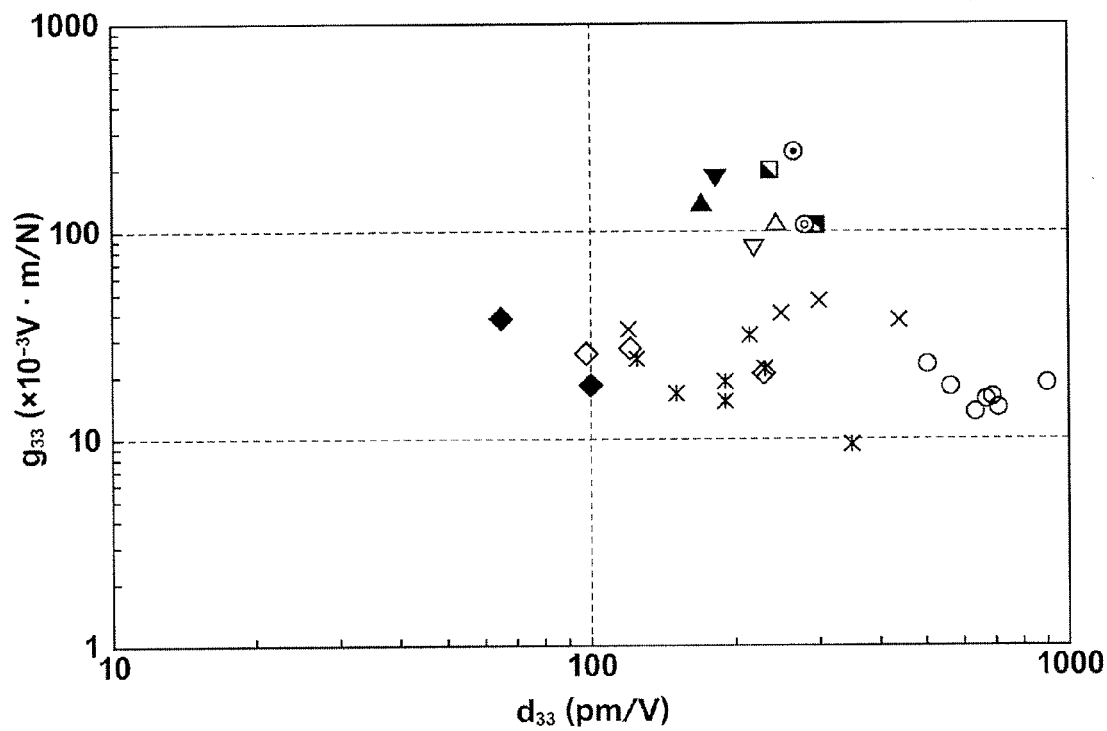
FIG. 4 illustrates the relationship between the piezoelectric strain constant and voltage output constant of a non-lead piezoelectric body of the present invention and existing piezoelectric bodies of lead and non-lead materials.

But, as a result of studies of compositions, manufacturing methods, crystal orientations, and the like, made by the present inventors for achieving the object described above, the present inventors have succeeded in obtaining a piezoelectric body which satisfies Formulae (3) and (4) below and is excellent in both $d_{33}$ and $g_{33}$ values, that is, excellent in both transmission and reception capabilities by forming a piezoelectric body which, while having the same dielectric constant $\in_{33}$, has a larger $d_{33}$ value in comparison with conventional materials, deviating largely from linear lines shown in FIG. 3, that is, by forming a piezoelectric body satisfying Formulae (1) and (2) above (FIG. 4, compositions are shown in FIG. 4. For more detail, refer to Japanese Patent Application No. 2009-162423).

$$100 < d_{33}(\text{pm/V}) \quad\quad (3)$$

$$80 < g_{33}(\times 10^{-3} \text{V·m/N}) \quad\quad (4)$$

($g_{33}$ is the voltage output constant (piezoelectric sensitivity constant) of the piezoelectric body)

As described above, in a perovskite type oxide, it is said that the greater the mass difference between A-site ions and B-site ions $|M_A-M_B|$, the higher the electromechanical coupling coefficient k and greater the d constant. In the mean time, the value of s is an inverse number of Young's modulus and it is, therefore, possible to improve the performance to a certain extent by selecting a material having a comparatively low Young's modulus, but the value range is limited in a way by usable materials. Therefore, in order to increase the value of $d_{33}$ without increasing the relative dielectric constant, it is preferable to increase the value of $k_{33}$.

For example, it is possible to increase the d constant without significantly increasing the relative dielectric constant by including $BaTiO_3$ as the first component and $BiFeO_3$ as the second component in General Formula (PX) above. Since the crystal system of $BiFeO_3$ is rhombohedral and that of $BaTiO_3$ is tetragonal, the perovskite oxide having these two components may form an MPB composition. As such, a higher d constant may be realized using the piezoelectric strains described in (3) and (4) above.

When providing an MPB composition, it is only required to form a composition that satisfies Formula (5) below. More preferably, a third component D that satisfies Formula (6) below is included therein. It is further preferable that the third component D satisfies Formula (7) below. The third component D is an oxide of either $BiBO_3$ or $ACO_3$ in General Formula (PX).

$$0.97 \leq TF(PX) \leq 1.02 \quad (5)$$

$$TF(BiFeO_3) < TF(D) < TF(BaTiO_3) \quad (6)$$

$$0.97 \leq TF(D) \leq 1.02 \quad (7)$$

(where, TF(PX) represents the tolerance factor of the oxide represented by General Formula (PX), and $TF(BiFeO_3)$, TF(D), and $TF(BaTiO_3)$ are the tolerance factors of the respective oxides in parentheses.)

Figure 5:
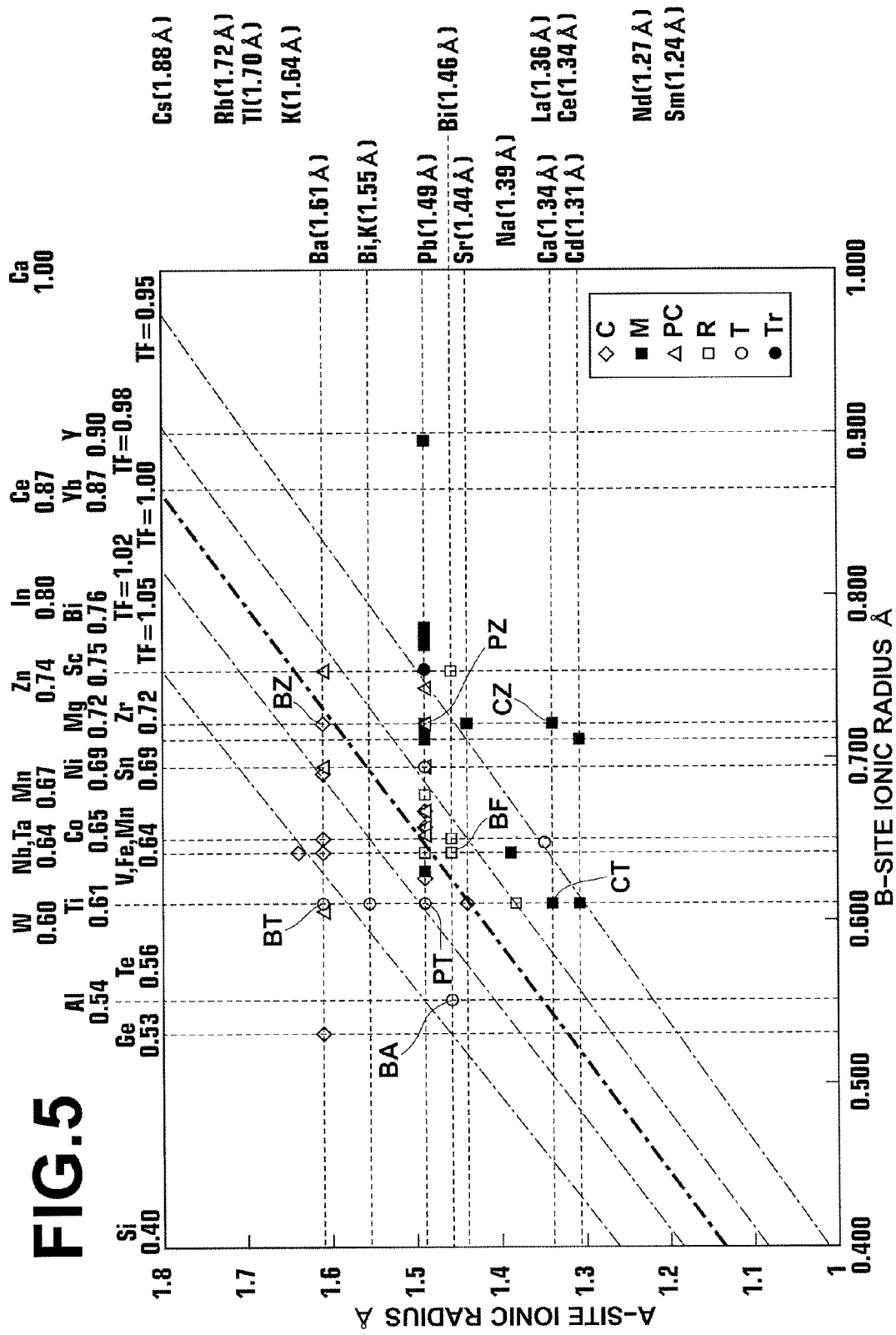
FIG. 5 illustrates relationships among the ionic radius of A-site element, ionic radius of B-site element, tolerance factor TF, and crystal system of various perovskite type oxides.

FIG. 5 illustrates the relationship between the average ionic radius of A-site element, average ionic radius of B-site element, tolerance factor TF, and crystal system with respect to each of various perovskite type oxides in which A-site includes one or two elements and B-site includes one or two elements. In the drawing, the following symbols represent the following crystal systems: C=cubic crystal; M=monoclinic crystal; PC=pseudocubic crystal; R=rhombohedral crystal; T=tetragonal crystal; and Tr=trigonal crystal. Two types of Mn are shown in FIG. 5 in which 0.64 Å indicates the ionic radius of trivalent Mn and 0.67 Å indicates the ionic radius of bivalent Mn.

The perovskite crystal lattice becomes closest-packed when TF=1.0. Under this condition, the B-site element does not substantially move in the crystal lattice and is likely to take a stable structure. With this composition, the peroviskite type oxide is likely to take a cubic crystal structure, a pseudocubic crystal structure, or the like, and does not show ferroelectricity or shows ferroelectricity with an extremely low level.

The B-site element is small with respect to the A-site element when TF>1.0. Under this condition, the B-site element is likely to enter into the crystal lattice even when the crystal lattice is not distorted and movable within the crystal lattice. With this composition, the peroviskite type oxide is likely to take tetragonal crystal structure (with spontaneous polarization axis in <001> direction) or the like, and has ferroelectricity. The level of the ferroelectricity tends to be increased as the TF value deviates from 1.0.

The B-site element is large with respect to the A-site element when TF<1.0. Under this condition, the B-site element does not enter the crystal lattice unless the crystal lattice is distorted. With this composition, the perovskite type oxide is likely to take orthorhombic crystal structure (with spontaneous polarization axis in <110> direction), rhombohedral crystal structure (with spontaneous polarization axis in <111> direction), or the like, and has ferroelectricity. The level of the ferroelectricity tends to be increased as the TF value deviates from 1.0.

Table 1 summarizes, with respect to each of various mixed crystals of first component with TF>1.0 and second component with TF<1.0, crystal system/A-site ionic radius/B-site ionic radius/TF/ratio (molar ratio) between the first and second components that forms morphotropic phase boundary (MPB) composition of each separate component, and A-site average ionic radius/B-site average ionic radius/TF of each of mixed crystals of first and second components having MPB compositions. In Table 1, the following symbols represent the following crystal systems: T=tetragonal crystal; O=orthorhombic crystal; and R=rhombohedral crystal.

As shown in Table 1, the TFs of MPB compositions fall within a range from 0.97 to 1.02. Thus, piezoelectric body 20p may have a composition of MPB or near MPB by providing a composition that satisfies $0.97 \leq TF(P) \leq 1.02$ - - - (5).

TABLE 1

| | | TF > 1 | | | | | TF < 1 | | | | | MPB | | |
|---|---|---|---|---|---|---|---|---|---|---|---|---|---|---|
| | | Crystal System | A-site Ion Radius | B-site Ion Radius | TF | Ratio | | Crystal System | A-site Ion Radius | B-site Ion Radius | TF | Ratio | A-site Ion Radius | B-site Ion Radius | TF |
| PT-PZ | $PbTiO_3$ | T | 1.49 | 0.605 | 1.019 | 0.48 | $PbZrO_3$ | R | 1.49 | 0.72 | 0.964 | 0.52 | 1.49 | 0.66 | 0.990 |
| PT-PS | $PbTiO_3$ | T | 1.49 | 0.605 | 1.019 | 0.45 | $PbSnO_3$ | R | 1.49 | 0.69 | 0.978 | 0.55 | 1.49 | 0.65 | 0.996 |
| PT-BiS | $PbTiO_3$ | T | 1.49 | 0.605 | 1.019 | 0.65 | $BiScO_3$ | R | 1.46 | 0.745 | 0.943 | 0.35 | 1.48 | 0.65 | 0.991 |
| BT-BiNT | BT | T | 1.61 | 0.605 | 1.062 | 0.15 | $(Bi, Na)TiO_3$ | R | 1.425 | 0.605 | 0.996 | 0.85 | 1.45 | 0.61 | 1.006 |
| BT-BiNT | BT | T | 1.61 | 0.605 | 1.062 | 0.07 | $(Bi, Na)TiO_3$ | R | 1.425 | 0.605 | 0.996 | 0.93 | 1.44 | 0.61 | 1.001 |
| BT-BiNT | $(Bi, K)TiO_3$ | T | 1.55 | 0.605 | 1.041 | 0.20 | $(Bi, Na)TiO_3$ | R | 1.425 | 0.605 | 0.996 | 0.80 | 1.45 | 0.61 | 1.005 |
| KN-NN | $KNbO_3$ | O | 1.64 | 0.64 | 1.054 | 0.49 | $NaNbO_3$ | O | 1.39 | 0.64 | 0.967 | 0.51 | 1.51 | 0.64 | 1.010 |

The TF value of the first component, $BaTiO_3$, is TF=1.059, and the TF value of the second component, $BiFeO_3$, is TF=0.989, that is, the perovskite oxide includes a first component with TF>1.0 and a second component with TF<1.0, which shows that the system having the two components may form an MPB. Accordingly, a perovskite type oxide with an MPB composition may be obtained by adjusting the composition ratio between the first and second components or further adjusting the composition ratio with the addition of third component D such that an overall TF falls within the range from 0.97 to 1.02 in General Formula (PX).

Specific examples of the third component for A-site include La, Ca, Sb, Bi, Si, Sr, and the like, and for B-site include Nd, Nb, Ta, Cr, Fe, Sc, and the like.

$SrTiO_3$ may be cited as an example of third component. The TF of $SrTiO_3$ is 1.002 which is nearly 1.0 (within the range from 0.97 to 1.01), so that addition of $SrTiO_3$ to $BaTiO_3$ and $BiFeO_3$ may cause the overall TF to fall within the range from 0.97 to 1.01. Another preferable third component may be $CaTiO_3$ other than $SrTiO_3$.

It is known that electrical property is improved by adding a dopant to A-site and B-site. Preferable elements as the dopant include metal ions, such as Mg, Ca, Sr, Ta, W, and Ln (lanthanide elements (La, Ce, Pr, Nd, Sm, Eu, Gd, Tb, Dy, Ho, Er, Tm, Yb, and Lu)), in addition to Nb and Mn described above.

$BiFeO_3$ is known as a material having a high Curie temperature. Accordingly, as the $BiFeO_3$ component is increased in General Formula (PX), so is the Curie temperature of piezoelectric body 20$p$. Therefore, the usability of the piezoelectric body 20$p$ under a high temperature environment is also increased and, therefore, piezoelectric body 20$p$ shows thermal stability even in the interior tire usage environment.

The perovskite oxide described above may have a three phase mixed crystal structure in which three components, $BaTiO_3$, $BiFeO_3$, and a third component coexist, or a single-phase structure in which the three components $BaTiO_3$, $BiFeO_3$, and the third component are completely solid solved into a single phase. Further, the perovskite oxide may have another structure.

Preferably, the crystal system of the third component is cubic or pseudo-cubic. The perovskite oxide having a three phase mixed crystal structure in which the first to third components coexist is an effective material for a field induced phase transition system proposed by the present inventors in U.S. Patent Application Publication No. 20090267998, and piezoelectric body 20$p$ may provide high piezoelectric performance.

The piezoelectric body 20$p$ that includes $BaTiO_3$ and $BiFeO_3$ with a near MPB composition may satisfy Formulae (3) and (4) above, that is, may provide high values for both d constant and g constant, resulting in a material of excellent power generation performance.

As described above, the piezoelectric body 20$p$ has high values for both d constant and g constant. Consequently, the piezoelectric composites 20$a$, 20$b$ that include the piezoelectric body 20$p$ are materials with high values for both d constant and g constant, and excellent in power generation performance.

Interior tire power generation apparatus 2 includes a piezoelectric section for generating an electric charge from deformation of a rolling tire, and the piezoelectric section includes an inorganic piezoelectric body of a porovskite type oxide (which may include an unavoidable impurity) having a composition represented by General Formula (PX) above. The present inventors have devised a material design method for providing high piezoelectric performance (d constant) for non-lead perovskite type oxides, and have found out, for the first time, such a perovskite type oxide as a composition having high piezoelectric performance comparable to that of a lead perovskite type oxide. Therefore, according to the present invention, non-lead interior tire power generation apparatus 2 having high power generation capability, and tire monitoring system 1 using apparatus 2 may be provided.

Further, the present inventors have found out, in the material design, a composition which is excellent in d constant, g constant, and balance between them. The performance index of power generation capability of a power generation apparatus is represented by the product of d constant and g constant. It is, therefore, preferable that the perovskite type oxide has a high value not only for the d constant but also for the g constant. Use of an inorganic piezoelectric body of such perovskite type oxide (which may include an unavoidable impurity) allows an unprecedented high performance interior tire power generation apparatus 2, excellent in both d constant and g constant, to be realized.

The piezoelectric body 20$p$, and piezoelectric composites 20$a$, 20$b$ are also preferable for use in piezoelectric section 30 of sensor 3. As sensor 3 functions as a strain sensor, a composition with a higher value of g constant is preferable. The piezoelectric body 20$p$, and piezoelectric composites 20$a$, 20$b$ may have a composition excellent in both d constant and g constant. Thus, interior tire power generation apparatus 2 and sensor 3 may use identical electrodes and piezoelectric sections, which is preferable from the viewpoint of simplicity in the manufacturing process.

[Design Change]

In the embodiment described above, the description has been made of a case in which the sensor 3 senses deformation of a tire, but other properties, such as temperature, rotation number of a tire, vehicle speed, and the like, may also be sensed.

Further, the description has been made of a case in which interior tire power generation apparatus 2 is provided on a substrate, but the structure thereof is not limited to this.

Still further, a piezoelectric composite with 1-3 connectivity and a piezoelectric composite with 0-3 connectivity are described by way of illustration, but the connectivity may be selected according to desired performance. The difference in performance depending on the connectivity can be found in the document of Ceramic Society of Japan described above and other documents related to the piezoelectric composite.

What is claimed is:

1. An interior tire power generation apparatus to be fixed on an interior surface of a tire, comprising:
   (i) a piezoelectric section having an inorganic piezoelectric body of a perovskite type oxide represented by the following General Formula (PX):

$$(Bi_x, A_{1-x})(B_y, C_{1-y})O_3 \qquad (PX)$$

where, A is an A-site element, other than Pb, with an average ionic valence of 2, B is a B-site element with an average ionic valence of 3, C is a B-site element with an average ionic valence of greater than 3, and each of A, B, and C is one or a plurality of types of metal elements; O is oxygen; B and C are of different compositions; and $0.6 < x < 1.0$, $x - 0.2 < y < x$;
   (ii) a pair of electrodes for extracting an electric charge generated in the piezoelectric section when the section is strained by an external force exerted on the tire; and
   (iii) an energy storage unit for storing the extracted electric charge,
   wherein the piezoelectric section comprises a polymer composite piezoelectric body constituted by an organic polymer resin matrix and the inorganic piezoelectric body included in the matrix.

2. The interior tire power generation apparatus of claim 1, wherein the A-site element A is at least one type of metal element selected from the group consisting of Mg, Ca, Sr, Ba, (Na, Bi), and (K, Bi).

3. The interior tire power generation apparatus of claim 1, wherein the B-site element B is at least one type of metal element selected from the group consisting of Al, Sc, Cr, Mn, Fe, Co, Ni, Cu, Ga, Y, In, and Re.

4. The interior tire power generation apparatus of claim 1, wherein a piezoelectric strain constant $d_{33}$ (pm/V) and a relative dielectric constant $\varepsilon_{33}$ of the inorganic piezoelectric body satisfy the following Formulae (1) and (2):

$$100 < \varepsilon_{33} < 1500 \qquad (1)$$

$$d_{33} \, (pm/V) > 12\sqrt{\varepsilon_{33}} \qquad (2).$$

5. The interior tire power generation apparatus of claim 4, wherein the piezoelectric strain constant $d_{33}$ and the relative dielectric constant $\epsilon_{33}$ of the inorganic piezoelectric body satisfy the following Formulae (3) and (4):

$$100 < d_{33} \,(\text{pm/V}) \qquad (3)$$

$$80 < g_{33} \,(\times 10^{-3} V \cdot m/N) \qquad (4).$$

6. The interior tire power generation apparatus of claim 1, wherein the perovskite type oxide includes $BaTiO_3$ as a first component and $BiFeO_3$ as a second component.

7. The interior tire power generation apparatus of claim 1, wherein the perovskite type oxide, represented by General Formula (PX), includes a first component with a tolerance factor greater than 1.0 and a second component with a tolerance factor smaller than 1.0, and satisfies the following Formula (5):

$$0.97 \leq TF\,(PX) \leq 1.02 \qquad (5)$$

where, TF(PX) represents the tolerance factor of the oxide represented by General Formula (PX).

8. The interior tire power generation apparatus of claim 1, wherein a difference between an average atomic weight $M_A$ of the A-site elements and an average atomic weight $M_B$ of the B-site elements, $|M_A - M_B|$, is greater than 145.

9. The interior tire power generation apparatus of claim 1, wherein the polymer composite piezoelectric body has 1-3 type connectivity.

10. A tire monitoring system, comprising:
an interior tire power generation apparatus to be fixed on an interior surface of a tire, comprising;
(i) a piezoelectric section having an inorganic piezoelectric body of a perovskite type oxide represented by the following General Formula (PX):

$$(Bi_x, A_{1-x})(B_y, C_{1-y})O_3 \qquad (PX)$$

where, A is an A-site element, other than Pb, with an average ionic valence of 2, B is a B-site element with an average ionic valence of 3, C is a B-site element with an average ionic valence of greater than 3, and each of A, B, and C is one or a plurality of types of metal elements; O is oxygen; B and C are of different compositions; and $0.6 \leq x \leq 1.0$, $x - 0.2 \leq y \leq x$;

(ii) a pair of electrodes for extracting an electric charge generated in the piezoelectric section when the section is strained by an external force exerted on the tire: and (iii) an energy storage unit for storing the extracted electric charge;

at least one sensor for detecting a predetermined property of the tire; and a wireless frequency unit for transmitting information obtained from the property detected by the sensor to a remote location so as to be monitored at the remote location, wherein the wireless frequency unit and/or the sensor is connected to the energy storage unit to receive power from the storage unit.

* * * * *